(12) United States Patent
Zhang et al.

(10) Patent No.: US 9,362,334 B2
(45) Date of Patent: Jun. 7, 2016

(54) DOUBLE-SIDED DISPLAY APPARATUS AND METHOD OF MANUFACTURING THE SAME

(71) Applicant: BOE TECHNOLOGY GROUP CO., LTD., Beijing (CN)

(72) Inventors: Feng Zhang, Beijing (CN); Qi Yao, Beijing (CN); Jingxia Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 14/241,199

(22) PCT Filed: Dec. 12, 2013

(86) PCT No.: PCT/CN2013/089248
§ 371 (c)(1),
(2) Date: Feb. 26, 2014

(87) PCT Pub. No.: WO2014/206026
PCT Pub. Date: Dec. 31, 2014

(65) Prior Publication Data
US 2015/0194467 A1    Jul. 9, 2015

(30) Foreign Application Priority Data
Jun. 26, 2013   (CN) .......................... 2013 1 0259988

(51) Int. Cl.
*H01L 33/00*      (2010.01)
*H01L 27/15*      (2006.01)
(Continued)

(52) U.S. Cl.
CPC ............ *H01L 27/156* (2013.01); *H01L 33/002* (2013.01); *H01L 33/005* (2013.01);
(Continued)

(58) Field of Classification Search
CPC .................. H01L 2924/0002; H01L 2924/00;
H01L 21/02601; H01L 25/048; H01L
25/0753; H01L 27/3267; H01L 51/502
See application file for complete search history.

(56) References Cited

U.S. PATENT DOCUMENTS 6,819,386 B2 * 11/2004 Roosendaal ...... G02F 1/133553
349/113
7,294,961 B2 * 11/2007 Daniels ..................... F21K 9/00
257/E25.02

(Continued)

FOREIGN PATENT DOCUMENTS

CN          1318154 A       10/2001
CN          1365247 A       8/2002
(Continued)

OTHER PUBLICATIONS

Second Office Action issued by the Chinese Patent Office for Chinese Patent Application No. 201310259988.9 dated Mar. 19, 2015, 8pgs.

(Continued)

*Primary Examiner* — Jaehwan Oh
(74) *Attorney, Agent, or Firm* — Ladas & Parry LLP

(57) ABSTRACT

A double-sided display apparatus and a method of manufacturing the same are provided. The double-sided display apparatus includes a first substrate and a second substrate arranged opposite to each other; a first transparent electrode and a second reflective electrode arranged on the first substrate; a first reflective electrode opposed to the first transparent electrode on the first substrate and a second transparent electrode opposed to the second reflective electrode on the first substrate arranged on the second substrate; and a quantum light-emitting layer arranged between the respectively corresponded transparent electrodes and reflective electrodes, the quantum light-emitting layer including charge transport particles and QD light-emitting material mixed therein. The provided double-sided display apparatus is lighter, thinner, more portable, and of low cost.

20 Claims, 3 Drawing Sheets

(51) Int. Cl.
*H01L 51/50* (2006.01)
*H01L 33/06* (2010.01)
*H01L 33/40* (2010.01)
*H01L 33/42* (2010.01)
*H01L 27/32* (2006.01)
*B82Y 20/00* (2011.01)

(52) U.S. Cl.
CPC ............. *H01L 33/06* (2013.01); *H01L 33/405* (2013.01); *H01L 33/42* (2013.01); *H01L 51/502* (2013.01); *B82Y 20/00* (2013.01); *H01L 27/3267* (2013.01); *H01L 2933/0016* (2013.01)

(56) References Cited

U.S. PATENT DOCUMENTS

| | | | |
|---|---|---|---|
| 2002/0084747 A1 | 7/2002 | Fujieda et al. | |
| 2007/0057263 A1 | 3/2007 | Kahen | |
| 2009/0278452 A1* | 11/2009 | Kim | H01L 25/048 313/504 |
| 2010/0276731 A1 | 11/2010 | Nam et al. | |
| 2011/0284819 A1* | 11/2011 | Kang | B82Y 20/00 257/9 |

FOREIGN PATENT DOCUMENTS

| | | |
|---|---|---|
| CN | 1690785 A | 11/2005 |
| CN | 1752800 A | 3/2006 |
| CN | 1784101 A | 6/2006 |
| CN | 101009321 A | 8/2007 |
| CN | 101263613 A | 9/2008 |
| CN | 102255019 A | 11/2011 |
| CN | 102646697 A | 8/2012 |
| CN | 102708758 A | 10/2012 |
| CN | 203288188 U | 11/2013 |
| EP | 1122585 A1 | 8/2001 |
| EP | 1662591 A2 | 5/2006 |

OTHER PUBLICATIONS

English translation of Second Office Action issued by the Chinese Patent Office for Chinese Patent Application No. 201310259988.9 dated Mar. 19, 2015, 10pgs.
English Abstract of CN1690785A (listed above in Foreign Patent Documents); 1pg.
English Abstract of CN1318154A (listed above in Foreign Patent Documents); 2pgs.
English Abstract of CN1365247A (listed above in Foreign Patent Documents); 1pg.
Third Chinese Office Action dated Aug. 25, 2015; Appln. No. 201310259988.9.
International Search Report for International Application No. PCT/CN2013/089248 issued Mar. 27, 2014, 14pgs.
First Office Action issued by the Chinese Patent Office for Chinese Patent Application No. 201310259988.9 dated Jul. 21, 2014, 4pgs.
English translation of First Office Action issued by the Chinese Patent Office for Chinese Patent Application No. 201310259988.9 dated Jul. 21, 2014, 4pgs.
Third Chinese Office Action Appln. No. 201310165803.6, Dated Dec. 30, 2015.

* cited by examiner

DOUBLE-SIDED DISPLAY APPARATUS AND METHOD OF MANUFACTURING THE SAME

CROSS REFERENCE TO RELATED APPLICATIONS

This application is based on International Application No. PCT/CN2013/089248 filed on Dec. 12, 2013, which claims priority to Chinese National Application No. 201310259988.9 filed on Jun. 26, 2013. The entire contents of each and every foregoing application are incorporated herein by reference.

TECHNICAL FIELD

Embodiments of the present invention relate to a double-sided display apparatus and a method of manufacturing the same.

BACKGROUND

Quantum Dot (QD), also referring to Nanocrystalline, is a kind of nano-particles consisting of II-VI or III-V group elements, such as CdSe, CdS, CdTe, ZnSe, ZnTe, ZnS and HgTe of II-VI group semiconductor compounds, or InAs and InP of III-V group semiconductor compounds or nano-particles. A Quantum Dot normally has a diameter in a range of 1 nm to 10 nm. Since electrons and holes are quantum confined, a continuous energy band structure becomes a discrete energy level structure with molecule characteristic, and the quantum dot can emit fluorescence after being excited. The emission spectrum of the QDs can be controlled by changing the size of the QDs, and the emission spectrum of the QDs can cover the whole visible region by changing the size and the chemical composition of the QDs. For CdTe QDs, for example, when the diameter of particles is increased from 2.5 nm to 4.0 nm, their emission wavelength can red shift from 510 nm to 660 nm.

Currently, as a light-emitting material, the QDs have been used in some display field. The display device made by using the QDs as the light-emitting material refers to Quantum Dot-Light-emitting Display (QD-LED). Structure of a conventional QD-LED is similar to that of an Organic Light-Emitting Display (OLED). But, compared with the OLED, the QD-LED can exhibit ideally natural colors by changing the size of the QDs. Further, the QD-LED has better color rendering and brightness. Due to these reasons, the QD-LED is attracting more attentions.

Most of the current displays are single-sided displays, with another side of the displays displaying no information. But, under some special situation, such as an information displaying board in a departure hall of an airport, a waiting hall of a train station, or an large exhibition hall, or information displaying board used in a business hall of a service industry such as communication industry, government service, financial industry, or transport industry, a double-sided display is often needed to help the user get the needed information. A conventional double-sided display is often made from two single sided displays attached together back to back, which increases the weight and thickness of products, and also not caters to the trend of lighter, thinner and more portable of modern electronic products.

A feasible solution is to use the QDs as the light-emitting material to make a double-sided display device. But, if a conventional process of QD-LED by layer to layer preparation is used, normally, it needs preparing in turn a transparent anode, a hole transport layer, a quantum light-emitting layer, an electron transport layer, a reflective cathode, or more other layers, which involves numerous of process steps. As such, the preparation efficiency and the yield of the product are low and the production cost is increased.

SUMMARY

Embodiments of the present invention provide a double-sided display apparatus by using quantum dots as light-emitting material, so that the display apparatus has improved display quality and is lighter, thinner and more portable. And embodiments of the present invention also provide a method of manufacturing the double-sided display apparatus.

In one aspect of the present invention, a double-sided display apparatus comprises: a first substrate and a second substrate arranged opposite to each other; a first transparent electrode and a second reflective electrode with opposite polarities arranged on the first substrate, wherein one of the first transparent electrode and the second reflective electrode is anode, the other is cathode; a first reflective electrode opposed to the first transparent electrode on the first substrate and a second transparent electrode opposed to the second reflective electrode on the first substrate arranged on the second substrate; and a quantum light-emitting layer arranged between the first transparent electrode and the first reflective electrode opposed to each other and between the second transparent electrode and the second reflective electrode opposed to each other, wherein the quantum light-emitting layer includes charge transport particles and quantum dots (QDs) light-emitting material.

In an example of the present invention, the charge transport particles include semiconductor nano-particles.

In an example of the present invention, the charge transport particles are p type semiconductor nano-particles and n type semiconductor nano-particles.

In an example of the present invention, the charge transport particles are p type semiconductor nano-particles, and an electron transport layer is arranged between the quantum light-emitting layer and a cathode.

In an example of the present invention, the charge transport particles are n type semiconductor nano-particles, and a hole transport layer is arranged between the quantum light-emitting layer and an anode.

In an example of the present invention, the first transparent electrode and the second reflective electrode are spaced apart from each other on the first substrate, and the first reflective electrode and the second transparent electrode are spaced apart from each other on the second substrate.

In another aspect of the present invention, a method of manufacturing a double-sided display apparatus comprises: providing a first substrate and a second substrate arranged opposite to each other; forming a first transparent electrode and a second reflective electrode with opposite polarities on a side of the first substrate; forming a quantum light-emitting layer including charge transport particles and quantum dot (QD) light-emitting material on the first transparent electrode and the second reflective electrode; and forming, over the quantum light-emitting layer on a side of the second substrate facing the first substrate, a first reflective electrode opposed to the first transparent electrode on the first substrate, and a second transparent electrode opposed to the second reflective electrode on the first substrate.

In an example of the present invention, the first transparent electrode and the second reflective electrode are spaced apart from each other on the side of the first substrate.

In an example of the present invention, the first reflective electrode and the second transparent electrode are spaced apart from each other on the side of the second substrate facing the first substrate.

In an example of the present invention, the forming a quantum light-emitting layer comprises forming the quantum light-emitting layer on the first transparent electrode and the second reflective electrode by applying a quantum light-emitting solution dispersed with charge transport particles and QD light-emitting material by a solution coating process.

In an example of the present invention, the quantum light-emitting solution includes a solvent and semiconductor nano-particles dispersed in the solvent.

In an example of the present invention, the semiconductor nano-particles are p and n type semiconductor nano-particles.

In an example of the present invention, the semiconductor nano-particles are p type semiconductor nano-particles. The method further includes forming an electron transport layer between the quantum light-emitting layer and a cathode.

In an example of the present invention, the semiconductor nano-particles are n type semiconductor nano-particles. The method further includes forming a hole transport layer between the quantum light-emitting layer and an anode.

In an example of the present invention, the solvent includes one or more of water, toluene and chloroform.

BRIEF DESCRIPTION OF THE DRAWINGS

Embodiments of the present invention will be described in more detail below with reference to the accompanying drawings to allow one of ordinary skill in the art to understand the present invention more clearly, in which.

Figure 1:
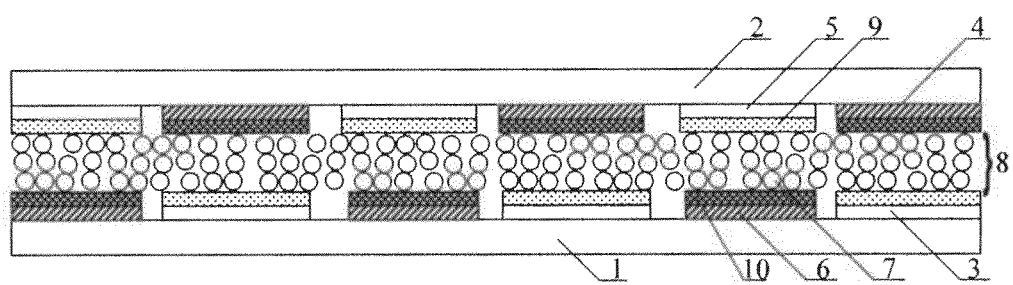
FIG. 1 is a schematic section view of a double-sided display apparatus in conventional technique.

1: first substrate; 2: second substrate; 3: first transparent anode; 4: first reflective cathode; 5: second transparent anode; 6: second reflective cathode; 7: quantum dot (QD) light-emitting material; 8: quantum light-emitting layer; 9: hole transport layer; 10: electron transport layer; 11: n type semiconductor nano-particles; 12: p type semiconductor nano-particles.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the terminologies used herein have the same meanings as commonly understood by one of ordinary skill in the art to which the present invention belongs. The terms "first," "second," etc., which are used in the description and the claims of the present application, are not intended to indicate any sequence, amount or importance, but for distinguishing various components. Also, the terms such as "a/an," "one," or "the/said" etc., are not intended to limit the amount, but for indicating the existence of at lease one. The terms "comprise/comprising," "include/including," etc., are intended to specify that the elements or the objects stated before these terms encompass the elements or the objects and equivalents thereof listed after these terms, but not preclude other elements or objects. "On," "above," "under," "below" and the like are only used to indicate relative position relationship, and when the position of the object which is described is changed, the relative position relationship may be changed accordingly.

A double-sided display apparatus provided by embodiments of the present invention, comprises a first substrate and a second substrate arranged opposite to each other, wherein a transparent electrode and a reflective electrode are arranged on the first substrate. To simplify the description, in the present embodiment, the transparent electrode refers to an anode, and the reflective electrode refers to a cathode. Thus, the transparent electrode and the anode collectively refer to transparent anode, and the reflective electrode and the cathode collectively refer to reflective cathode. A reflective cathode opposed to the transparent anode on the first substrate and a transparent anode opposed to the reflective cathode on the first substrate are arranged on the second substrate. The first substrate or the second substrate is also provided with driver thin film transistors (TFTs) to independently drive the transparent anode(s) and reflective cathode(s), and packages or the like. The substrates can be substrates based on inorganic material, such as glass substrates, quartz substrates, or the like; and also can be substrates based on organic material.

In accordance with the embodiment(s) of the present invention, a quantum light-emitting layer 8 is arranged between the transparent anodes and the reflective cathodes. The quantum light-emitting layer 8 has charge transport particles and quantum dot (QD) light-emitting material 7 mixed therein.

As illustrated in FIG. 1, a conventional double-sided display made by conventional layer by layer process includes a first substrate 1 and a second substrate 2. First transparent anodes 3 and second reflective cathodes 6 are arranged and spaced apart from each other on the first substrate 1, and first reflective cathodes 4 opposed to the first transparent anodes 3 and second transparent anodes 5 opposed to the second reflective cathodes 6 are arranged on the second substrate 2. The transparent anodes can be made of transparent conductive materials, such as indium tin oxide, zinc oxide, indium oxide, tin oxide, indium zinc oxide and the like. A hole transport layer 9 consisting of hole transport particles is arranged on every transparent anodes. The reflective cathodes can be made of calcium, aluminum, magnesium, silver, barium, and alloys thereof. The reflective cathodes can reflect the light emitted from the quantum light-emitting layer 8 so that the light can exit through the transparent anodes. An electron transport layer 10 consisting of electron transport particles is arranged on each reflective cathode. The quantum light-emitting layer 8 is provided between the hole transport layer 9 and electron transport layer 10. The operation principle of the double-sided display apparatus is as below: drived by the driver TFT, the transparent anodes inject holes to the quantum light-emitting layer 8, the reflective cathodes inject electrons to the quantum light-emitting layer 8, and the holes and electrons immigrates to the quantum light-emitting layer 8 respectively from the hole transport layer 9 and the electron transport layer 10; then, the holes and the electrons meet in the quantum light-emitting layer 8 and bound to each other to become excited excitons; an energy difference will be produced when the excitons radiatively transist from the excited state to the ground state, which release light energy being reflected by the first reflective cathode, exiting through the first transparent anode, and reflected by the second reflective cathode and exiting through the second transparent anode. Since the emission peak half-width (30 nm-50 nm) of the quantum light-emitting material is narrow, the emitting light is purer, such that the double-sided display apparatus has improved color gamut, brightness and display quality.

However, the double-sided display apparatus made by a layer by layer preparation process of a conventional technique consists of three or more layers in addition to the electrodes, thus its structure is complicated. And most of the layers except the quantum light-emitting layer 8 are formed in a vacuum deposition process, it needs a very special preparation environment, which increases the production time and cost significantly. Since the structure is complicated, it needs more preparation steps, which can reduce the yield of the products. In contrast, in the embodiments of the present invention, charge transport particles are mixed in the quantum light-emitting layer 8, and the charge transport particles act similarly as the hole transport layer 9 or the electron transport layer 10. As such, the double-sided display apparatus consists of two layers or one layer besides electrodes, such that the structure is simplified. The charge transport particles normally are semiconductor nano-particles. They can be p type semiconductor nano-particles, such as nickel oxide, vanadium oxide, molybdenum oxide, chromium oxide and barium oxide semiconductor nano-particles or the like. They also can be n type semiconductor particles, such as titanium dioxide, zinc oxide, indium oxide, aluminum oxide, zirconium oxide, tin oxide, tungsten oxide semiconductor nano-particles or the like.

Figure 2:
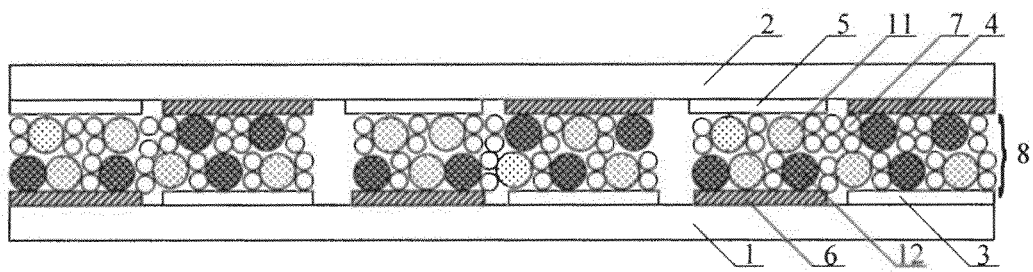
FIG. 2 is a schematic section view of a double-sided display apparatus in an embodiment of the present invention.

In an implementation of the present embodiments, both the p type semiconductor nano-particles 12 and n type semiconductor nano-particles 11 are mixed into the quantum light-emitting layer 8. As illustrated in FIG. 2, such kind of double-sided display apparatus only consists of a quantum light-emitting layer 8 besides electrodes, which structure is quite simple and thus the preparation process is simplified significantly. Method(s) of manufacturing the double-sided display apparatus will be described below in conjunction with FIGS. 2 and 3.

Figure 3:
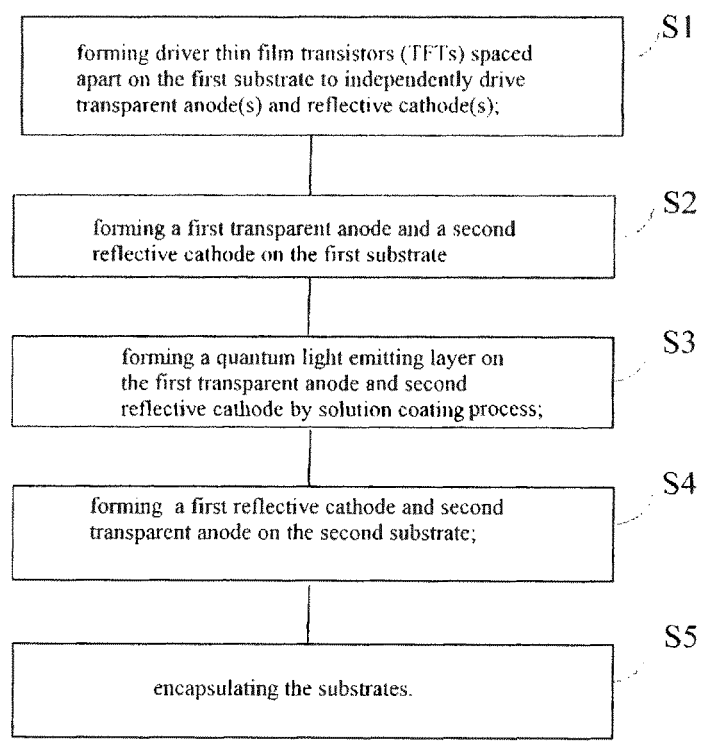
FIG. 3 is a flow chart of a method of manufacturing the double-sided display apparatus as shown in FIG. 2.

The method of manufacturing a double-sided display apparatus as illustrated in FIG. 3, includes:

S1: preparing a first substrate 1 by mask process, forming driver thin film transistors (TFTs) spaced apart on the first substrate 1 to independently drive transparent anode(s) and reflective cathode(s); each pixel may include two driver TFTs to independently drive the transparent anodes and reflective cathodes respectively, or each of adjacent pixels includes a driver TFT to independently drive the transparent anode(s) and reflective cathode(s).

S2: forming a first patterned transparent anode 3 over the driver TFT to drive the transparent anode by sputtering, evaporation or spin coating process; and forming a second patterned reflective cathode 6 over the driver TFT to drive the reflective cathode by sputtering, evaporation, spin coating process or the like.

S3: forming a quantum light-emitting layer 8 mixed with p type semiconductor particles 12, n type semiconductor particles 11 and QD light-emitting material 7 over the first transparent anode 3 and the second reflective cathode 6.

In this embodiment, the step S3 may include, firstly, dispersing the QD light-emitting material, the p type semiconductor particles which can transport holes, the n type semiconductor particles which can transport electrons in a solvent to form a quantum light-emitting solution. The solvent in the quantum light-emitting solution may be water, toluene and chloroform or the like; and then, forming a quantum light-emitting layer 8 by applying the quantum light-emitting solution over the first transparent anode 3 and the second reflective cathode 6 by solution coating process. For example, applying the quantum light-emitting solution in each of sub-pixels by any ways of spin coating, ink jet and slit coating, such that the quantum light-emitting layer 8 is formed with QD light-emitting material 7, hole transport particles, and electron transport particles mixed therein.

Compared with the preparation process of layer by layer and vacuum evaporation of a conventional technique, the present embodiment can form the quantum light-emitting layer, hole transport layer and electron transport layer through only one step by using spin coating, ink jet, or slit coating of common solution applying process, and it requires less to the preparation environment, as well as it can increase preparation speed of the double-sided display apparatus significantly. Thus, it simplifies the preparation process of the double-sided display apparatus significantly and reduces the production cost.

S4: forming, over the quantum light-emitting layer 8 on the second substrate 2, a first reflective cathode 4 opposed to the first transparent anode 3 by sputtering, evaporation, spin coating process or the like; and forming, over the quantum light-emitting layer 8 on the second substrate 2, a second transparent anode 5 opposed to the second reflective cathode 6 by sputtering, evaporation, spin coating process or the like.

S5: encapsulating the prepared first substrate 1 and the second substrate 2 to complete the manufacture of the double-sided display apparatus.

It is appreciated that in practical preparation process, the first reflective cathode 4 and the second transparent anode 5 are only needed to be arranged over the quantum light-emitting layer 8. For example, the first reflective cathode 4 and the second transparent anode 5 may be formed on the quantum light-emitting layer 8 directly, but not need to be formed on the second array substrate 2.

Besides the embodiments described above, the double-sided display apparatus of the present embodiment may have only one kind of the hole transport particles and electron transport particles mixed in the quantum light-emitting layer 8, and correspondingly, the electron transport layer 10 is formed on the reflective cathode, or the hole transport layer 9 is formed on the transparent anode.

Figure 4:
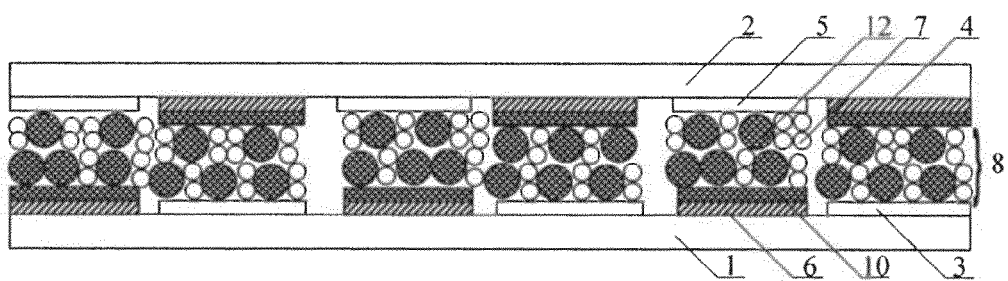
FIG. 4 is a schematic section view of a double-sided display apparatus in another embodiment of the present invention.

For example, as illustrated in FIG. 4, the charge transport particles are p type semiconductor nano-particles 12. An electron transport layer 10 is arranged between the quantum light-emitting layer 8 and the reflective cathode. Compared with the method of making the double-sided display apparatus having the quantum light-emitting layer mixed with p and n type semiconductor nano-particles, this method of making the double-sided display apparatus disperses the QD light-emitting material and the p type semiconductor nano-particles 12 which can transport holes in the solvent to form a quantum light-emitting solution, and forms the electron transport layer 10 which can transport electrons between the quantum light-emitting layer 8 and the reflective cathode. Compared with the preparation process of layer by layer and vacuum evaporation of a conventional technique, the present embodiment can form the quantum light-emitting layer and the hole transport layer through only one step by using spin coating, ink jet, or slit coating of common solution applying process, and it requires less to the preparation environment, as well as it can increase preparation speed of the double-sided display apparatus significantly. Thus, it simplifies the preparation process of the double-sided display apparatus significantly and reduces the production cost.

Figure 5:
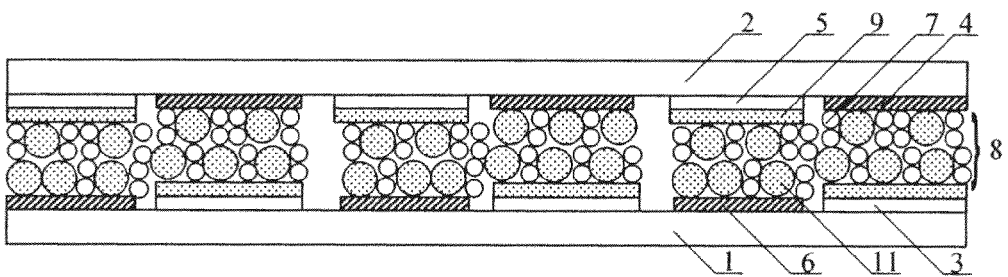
FIG. 5 is a schematic section view of a double-sided display apparatus in yet another embodiment of the present invention.

For example again, as illustrated in FIG. 5, the electron transport particles are n type semiconductor nano-particles 11. A hole transport layer 9 is arranged between the quantum light-emitting layer 8 and the transparent anode. Compared with the method of making the double-sided display apparatus having the quantum light-emitting layer mixed with p and n type semiconductor nano-particles, this method of making the double-sided display apparatus disperses the QD light-emitting material and the n type semiconductor nano-particles 11 which can transport electrons in the solvent to form a quantum light-emitting solution, and forms the hole transport layer 10 which can transport holes between the quantum light-emitting layer 8 and the transparent anode. Compared with the preparation process of layer by layer and vacuum evaporation of a conventional technique, the present embodiment can form the quantum light-emitting layer and the electron transport layer through only one step by using spin coating, ink jet, or slit coating of common solution applying process, and it requires less to the preparation environment, as well as it can increase preparation speed of the double-sided display apparatus significantly. Thus, it simplifies the preparation process of the double-sided display apparatus significantly and reduces the production cost.

The double-sided display apparatus as provided by the embodiments of the present invention can have improved color gamut, brightness, and display quality due to the narrow emission peak half width and purer emitted light of a QD light-emitting material by arranging a quantum light-emitting layer including the QD light-emitting material between the transparent electrode(s) and the reflective electrode(s). And it has simplified structure by mixing the charge transport particles in the quantum light-emitting layer, and thus, it can be made by less producing steps and less production cost. It realizes double-direction displaying via only one display panel. And compared with conventional single-sided display device, it does not have increased thickness and weight, and thus, it is more portable, lightweight, thinner, and low cost.

It is to be understood that the described embodiments are only illustrative. Based on the described embodiments of the present invention, various other embodiments can be obtained by an ordinary skill in the art. For example, among others, the transparent electrode(s) can be cathode(s), and the reflective electrode(s) can be reflective anode(s), i.e., it is not limited to the transparent anodes and reflective cathodes of the present embodiments.

It will be obvious that the embodiments of the present invention can be modified or varied in many ways by the skilled in the art without departure from the spirit and scope of the invention, and all such modifications and variants and the equivalents thereof are intended to fall into the scope of the appended claims.

What is claimed is:

1. A double-sided display apparatus comprising:
 a first substrate and a second substrate arranged opposite to each other;
 a first transparent electrode and a second reflective electrode arranged on a surface of the first substrate, one of the first transparent electrode and the second reflective electrode being an anode, and the other of the first transparent electrode and the second reflective electrode being a cathode;
 a first reflective electrode opposed to the first transparent electrode on the first substrate and a second transparent electrode opposed to the second reflective electrode on the first substrate arranged on a surface of the second substrate facing the first substrate, wherein the first transparent electrode and the first reflective electrode have opposite electric polarities and the second transparent electrode and the second reflective electrode have opposite electric polarities; and
 a quantum light-emitting layer arranged between the first transparent electrode and the first reflective electrode opposed to each other and between the second transparent electrode and the second reflective electrode opposed to each other, wherein the quantum light-emitting layer includes charge transport particles and quantum dot (QD) light-emitting material.

2. The double-sided display apparatus according to claim 1, wherein the charge transport particles include semiconductor nano-particles.

3. The double-sided display apparatus according to claim 2, wherein the charge transport particles are p type semiconductor nano-particles and n type semiconductor nano-particles.

4. The double-sided display apparatus according to claim 2, wherein the charge transport particles are p type semiconductor nano-particles; and an electron transport layer is arranged between the quantum light-emitting layer and a cathode.

5. The double-sided display apparatus according to claim 2, wherein the charge transport particles are n type semiconductor nano-particles; and a hole transport layer is arranged between the quantum light-emitting layer and an anode.

6. The double-sided display apparatus according to claim 1, wherein the first transparent electrode and the second reflective electrode are spaced apart from each other on the surface of the first substrate, and the first reflective electrode and the second transparent electrode are spaced apart from each other on the surface of second substrate facing the first substrate.

7. A method of manufacturing a double-sided display apparatus comprising:
 providing a first substrate and a second substrate arranged opposite to each other;
 forming a first transparent electrode and a second reflective electrode with opposite polarities on a surface of the first substrate, one of the first transparent electrode and the second reflective electrode being an anode, and the other of the first transparent electrode and the second reflective electrode being a cathode;
 forming a quantum light-emitting layer having charge transport particles and quantum dot light-emitting material mixed therein on the first transparent electrode and the second reflective electrode; and
 forming a first reflective electrode opposed to the first transparent electrode on the first substrate and a second transparent electrode opposed to the second reflective electrode on the first substrate over the quantum light-emitting layer on a surface of the second substrate facing the surface of the first substrate, wherein the first transparent electrode and the first reflective electrode have opposite electric polarities and the second transparent electrode and the second reflective electrode have opposite electric polarities.

8. The method of manufacturing the double-sided display apparatus according to claim 7, wherein the first transparent electrode and the second reflective electrode are spaced apart from each other on the surface of the first substrate.

9. The method of manufacturing the double-sided display apparatus according to claim 8, wherein the first reflective electrode and the second transparent electrode are spaced apart from each other on the surface of the second substrate facing the first substrate.

10. The method of manufacturing the double-sided display apparatus according to claim 7, wherein the forming a quantum light-emitting layer comprises forming the quantum light-emitting layer on the first transparent electrode and the second reflective electrode by applying a quantum light-emitting solution dispersed with charge transport particles and quantum dot light-emitting material by a solution coating process.

11. The method of manufacturing the double-sided display apparatus according to claim 10, wherein the quantum light-emitting solution includes solvent and semiconductor nano-particles dispersed in the solvent.

12. The method of manufacturing the double-sided display apparatus according to claim 11, wherein the semiconductor nano-particles are p type and n type semiconductor nano-particles.

13. The method of manufacturing the double-sided display apparatus according to claim 11, wherein the semiconductor nano-particles are p type semiconductor nano-particles; and the method further comprises forming an electron transport layer between the quantum light-emitting layer and a cathode.

14. The method of manufacturing the double-sided display apparatus according to claim 11, wherein the semiconductor nano-particles are n type semiconductor nano-particles; and the method further comprises forming a hole transport layer between the quantum light-emitting layer and an anode.

15. The method of manufacturing the double-sided display apparatus according to claim 11, wherein the solvent includes one or more of water, toluene and chloroform.

16. The double-sided display apparatus according to claim 2, wherein the first transparent electrode and the second reflective electrode are spaced apart from each other on the surface of the first substrate, and the first reflective electrode and the second transparent electrode are spaced apart from each other on the surface of second substrate facing the first substrate.

17. The double-sided display apparatus according to claim 3, wherein the first transparent electrode and the second reflective electrode are spaced apart from each other on the surface of the first substrate, and the first reflective electrode and the second transparent electrode are spaced apart from each other on the surface of second substrate facing the first substrate.

18. The double-sided display apparatus according to claim 4, wherein the first transparent electrode and the second reflective electrode are spaced apart from each other on the surface of the first substrate, and the first reflective electrode and the second transparent electrode are spaced apart from each other on the surface of second substrate facing the first substrate.

19. The double-sided display apparatus according to claim 5, wherein the first transparent electrode and the second reflective electrode are spaced apart from each other on the surface of the first substrate, and the first reflective electrode and the second transparent electrode are spaced apart from each other on the surface of second substrate facing the first substrate.

20. The method of manufacturing the double-sided display apparatus according to claim 8, wherein the forming a quantum light-emitting layer comprises forming the quantum light-emitting layer on the first transparent electrode and the second reflective electrode by applying a quantum light-emitting solution dispersed with charge transport particles and quantum dot light-emitting material by a solution coating process.

* * * * *